United States Patent
Lyon

(10) Patent No.: US 7,909,665 B2
(45) Date of Patent: Mar. 22, 2011

(54) ELECTRICAL CONNECTOR

(75) Inventor: Michael Lyon, Bickerstaffe (GB)

(73) Assignee: Pilkington Group Limited, St Helens, Merseyside (GB)

( * ) Notice: Subject to any disclaimer, the term of this patent is extended or adjusted under 35 U.S.C. 154(b) by 160 days.

(21) Appl. No.: 12/294,396

(22) PCT Filed: Mar. 23, 2007

(86) PCT No.: PCT/GB2007/001069
§ 371 (c)(1),
(2), (4) Date: Oct. 17, 2008

(87) PCT Pub. No.: WO2007/110612
PCT Pub. Date: Oct. 4, 2007

(65) Prior Publication Data
US 2009/0170380 A1    Jul. 2, 2009

(30) Foreign Application Priority Data
Mar. 24, 2006   (GB) .................... 0605883.8

(51) Int. Cl.
*H01R 4/02* (2006.01)
*B60L 1/02* (2006.01)
*B32B 17/06* (2006.01)

(52) U.S. Cl. ......... 439/876; 439/874; 219/203; 428/426

(58) Field of Classification Search ................ 439/876, 439/874; 219/203; 428/426
See application file for complete search history.

(56) References Cited

U.S. PATENT DOCUMENTS

| | | | |
|---|---|---|---|
| 3,634,654 | A | 1/1972 | Peetz |
| 3,771,211 | A | 11/1973 | Postupack |
| 4,023,008 | A | 5/1977 | Durussel |
| 4,057,671 | A | 11/1977 | Shoop |
| 4,246,467 | A | 1/1981 | Boaz |
| 4,396,826 | A | 8/1983 | Orcutt et al. |
| 4,758,407 | A | 7/1988 | Ballentine et al. |
| 5,368,814 | A | 11/1994 | Gonya et al. |
| 5,616,417 | A | 4/1997 | Ryan |
| 5,738,554 | A | 4/1998 | Borger et al. |

(Continued)

FOREIGN PATENT DOCUMENTS

EP    0 488 878 A1    6/1992

(Continued)

OTHER PUBLICATIONS

Search Report issued in corres. GB0605883.8, Jul. 20, 2006, The Patent Office, South Wales, UK.

(Continued)

*Primary Examiner* — Hien Vu
(74) *Attorney, Agent, or Firm* — Buchanan Ingersoll & Rooney PC

(57) ABSTRACT

An improved electrical connector for use with a glazing is disclosed. The glazing preferably comprises a ply of glazing material having a first electrically conductive component mounted thereon, and a second electrically conductive component, joined to the first by a solder. The second component comprises first and second connector feet linked by a bridge portion, the bridge portion being at a height h above each of the connector feet, and each of the feet comprises at least one protrusion having a height d. At least one of h or d is chosen to maximise the adhesion between the second electrically conductive component and the first electrically conductive component. Preferably, the glazing is an automotive glazing.

20 Claims, 1 Drawing Sheet

U.S. PATENT DOCUMENTS

| | | | |
|---|---|---|---|
| 6,086,687 A | 7/2000 | Oud et al. | |
| 6,136,230 A | 10/2000 | Sanada | |
| 6,184,475 B1 | 2/2001 | Kitajima et al. | |
| 6,253,988 B1 | 7/2001 | Pereira | |
| 7,134,201 B2 * | 11/2006 | Ackerman et al. | 29/857 |
| 2002/0055282 A1 | 5/2002 | Eldridge et al. | |
| 2005/0112291 A1 * | 5/2005 | Okajima et al. | 427/447 |
| 2006/0240265 A1 | 10/2006 | Cook et al. | |

FOREIGN PATENT DOCUMENTS

| | | |
|---|---|---|
| EP | 0 704 727 A1 | 4/1996 |
| EP | 0 612 577 B1 | 5/1997 |
| EP | 1 080 824 A1 | 3/2001 |
| EP | 1 106 301 A1 | 6/2001 |
| EP | 1 199 289 A1 | 4/2002 |
| EP | 0 974 558 B1 | 1/2003 |
| EP | 1 488 972 A1 | 2/2004 |
| EP | 1 256 261 B1 | 10/2004 |
| GB | 1 163 224 A | 9/1969 |
| GB | 2 357 638 A | 6/2001 |
| JP | 2000-119046 A | 4/2000 |
| WO | WO 2004/068643 A | 8/2004 |

OTHER PUBLICATIONS

U.S. Appl. No. 12/294,204, filed Sep. 23, 2008, Lyon.
PCT/ISA/210 (International Search Report).

* cited by examiner

ELECTRICAL CONNECTOR

FIELD OF THE INVENTION

The present invention relates to an electrical connector for an automotive glazing.

BACKGROUND DISCUSSION

A variety of electrical connectors are used throughout the automotive glazing industry. For example, T-piece connectors may be used to connect an electrically conductive circuit, such as a circuit printed on the surface of a ply of glass, or an array of wires fixed within a laminated glazing, to the wiring harness of a vehicle. Such circuits generally find use as heating circuits, to promote de-misting or de-icing, or antenna circuits. The T-piece connector is soldered to an electrically conductive substrate known as a bus bar, which may be provided directly on the surface of a piece of glass, or fully or partly on a fired, printed band on the glass, known as an obscuration band. The bus bar is typically printed using a silver-containing ink. Traditionally, the solder used to join the bus bar and the connector contains lead. However, lead is known to be harmful, and there is increasing pressure to use lead-free solders in the automotive industry, for example, such as that described in WO2004/068643. WO2004/068643 discloses tin-based solders (up to 90% by weight tin), comprising a mechanical stress modifier selected from bismuth or indium. The solder may also contain silver and/or copper.

However, one disadvantage to using a lead-free solder is that the adhesion between the connector and the bus bar may not be as high as that given by a lead containing solder. One solution to this is to additionally use an adhesive to bear the mechanical load on the connector, as in EP 1 256 261.

Even if additional adhesive means are used, the adhesion between the connector and the bus bar due to the solder will degrade over time due to environmental conditions, such as extremes of temperature and humidity. Once the joint between the connector and the bus bar starts to degrade, the adhesion decreases and the connector may become loose or detach from the bus bar altogether. In addition, when the joint deteriorates, the quality of the electrical connection achieved may become poor. This degradation may be quicker if there are regions of poor adhesion due to air bubbles or debris at the surface where the connector and bus bar are joined. To improve the reliability of the joint therefore, great care must be taken not only in adhesive and solder selection, but with processing techniques and conditions.

SUMMARY

It is therefore desirable to be able to find an alternative manner in which to improve the reliability of the joint between the connector and the bus bar when exposed to various environmental conditions, which does not rely on materials selection or special processing techniques, but which aids in preventing degradation of both adhesion and electrical connectivity.

The present invention aims to address these problems by providing a glazing comprising a ply of glazing material having a first electrically conductive component mounted thereon, and a second electrically conductive component, joined to the first by a solder, the second component comprising first and second connector feet linked by a bridge portion, the bridge portion being at a height h above each of the connector feet, and each of the feet comprising at least one protrusion having a height d, wherein at least one of h or d is chosen to maximise the adhesion between the second electrically conductive component and the first electrically conductive component.

By optimising the design of the connector, the reliability of the joint between the first and second components is improved, without the need to provide additional adhesive or implement complex processing steps.

Preferably, h is in the range 1.0 mm to less than or equal to 5.0 mm. Preferably d is in the range 0.00 mm to 1.0 mm. More preferably, d is in the range 0.3 mm to 0.75 mm.

When the first electrically conductive component is placed on flat float glass, and the second electrically conductive component soldered thereto, at least one of h or d is chosen such that the mean load required to remove the second electrically conductive component is preferably greater than 20 kg.

More preferably, both h and d are chosen to improve the adhesion between the second electrically conductive component and the first electrically conductive component. Both h and d may be chosen to improve the adhesion between the second electrically conductive component and the first electrically conductive component, after 14 days at 50° C. and 95% relative humidity.

The second electrically conductive component may be made of copper. The first electrically conductive component may be a busbar. The surface of the ply of glazing material may be printed around its periphery with a fired ink band. In this case, at least part of the first electrical component may be provided on the fired-ink band.

Preferably, the second electrically conductive component is a T-piece connector. Preferably, the solder is a lead-free solder. Preferably, the glazing is an automotive glazing.

BRIEF DESCRIPTION OF DRAWING FIGURES

The invention will now be described by way of example only, and with reference to the accompanying drawings in which.

DETAILED DESCRIPTION

A variety of electrical connectors are used within the automotive glazing industry to connect circuitry provided on or within glazing panels with the wiring harness of a vehicle. A typical connector is known as a T-piece, and is generally in the shape of a "T", although other connectors, for example, J-shaped and strip-shaped connectors are known. Each type of connector has three features in common: two connector feet joined by a raised bridge portion; protrusions on the bottom of each connector foot; and each is formed from a thin strip or sheet of a metallic material, such as copper. However, it is also common to use connectors which do not have protrusions on the connector feet. Although the following examples are described in terms of T-pieces, the principles of the invention may be applied to all types of electrical connectors sharing these features.

Figure 1:
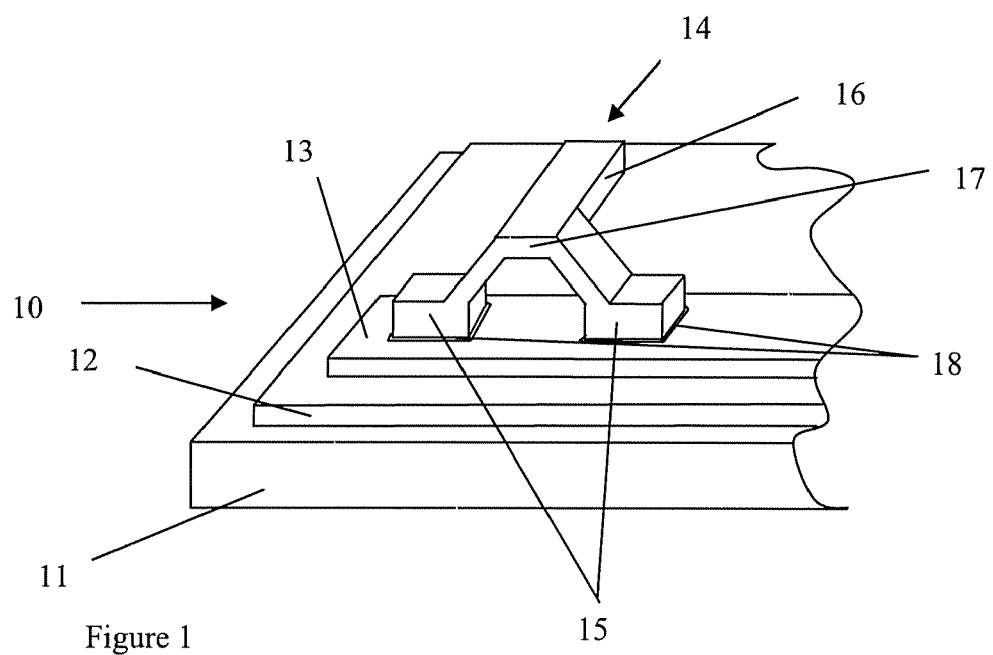
FIG. 1 is a perspective view (not to scale) of a glazing having an electrical connector mounted thereon.

FIG. 1 is a perspective view (not to scale) of an automotive glazing 10 having an electrical connector 14 soldered to an electrically conductive layer 13. The automotive glazing 10 comprises a sheet of glazing material 11, such as a ply of toughened glass, having a fired, black ceramic obscuration band 12 on one surface. An electrically conductive layer 13, known as a bus bar, is provided on the obscuration band 12, typically by printing the surface of the obscuration band 12 with an electrically conductive silver-containing ink. The obscuration band 12 is provided on glazings forming windscreens backlights and some rooflights, but may not be provided on glazings forming sidelights. In this case, the bus bar 13 is provided directly onto the surface of the glazing material 11.

An electrical connector 14 is mounted on the bus bar 13. The electrical connector 14 comprises a pair of connector feet 15, for attaching to the bus bar 13, and a connector arm 16, for attaching to the wiring harness of a vehicle in which the glazing is fitted. The connector feet 15 are linked together and joined to the connector arm 16 by a raised portion known as a bridge 17. Each of the connector feet 15 is attached to the glazing by means of a layer of solder 18, between each foot 15 and the bus bar 13.

Figure 2:
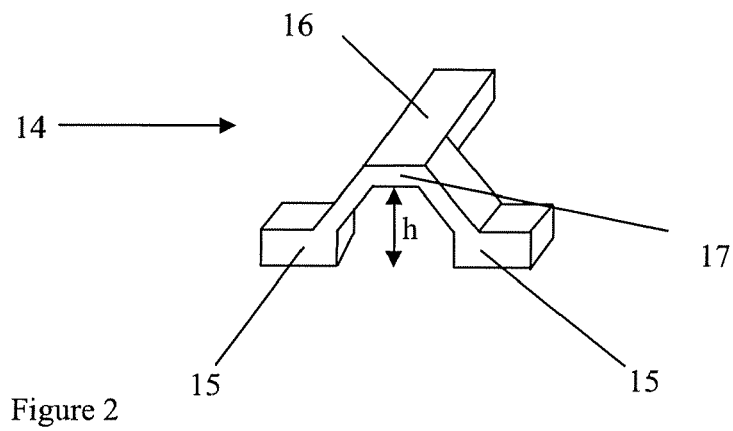
FIG. 2 is a perspective view (not to scale) of the electrical connector used in FIG. 1.

FIG. 2 is a perspective view (not to scale) showing the electrical connector 14 in more detail. The electrical connector 14 is formed from a thin strip or sheet of a metallic material, such as copper. The bridge 17 is in a fixed position with respect to the connector feet 15 and connector arm 16, so that when the electrical connector 14 is soldered in place, the bridge 17 is at a height h above the base of the connector feet 15.

Figure 3:
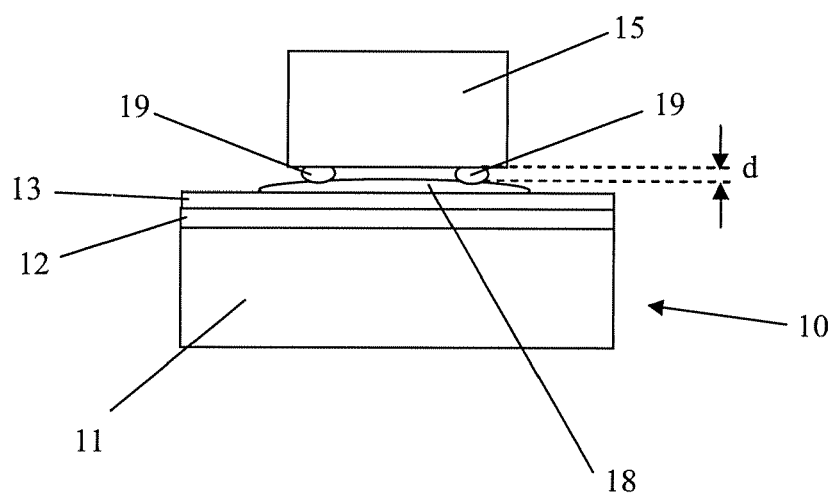
FIG. 3 is a schematic cross-section of part of the connector of FIG. 1.

FIG. 3 is a schematic cross-section of a single connector foot 15 mounted on the glazing 10. A pair of protrusions or dimples 19 are provided on the base of the connector foot 15, each having a height d. The protrusions 19 ensure that the main body of the foot 15 is kept at a set height above the bus bar 13. In use, the layer of solder 18 will completely surround the protrusions 19 and contact the base of the connector foot 15, but this is omitted from FIG. 3 for clarity.

The electrical connector 14 may be soldered to the bus bar using various techniques, including hot air, hot iron and resistive heating. The typical soldering time is between 1 and 3 seconds, with 2 to 4 seconds cooling time. During soldering of the connector feet 15 to the bus bar 13, the region of the glazing material 11 between the feet remains relatively cool compared with the connector bridge 17, which is heated almost to the soldering temperature. This leads to a differential in expansion between the connector bridge 17 and the glazing material 11. As the solder layer 18 sets, the temperature change on cooling for the connector bridge 17 is much greater than for the glazing material 11, leading to a differential in the contraction between the connector bridge 17, and the glazing material 11. This expansion and contraction mismatch leads to the generation of stress in the surface of the glazing material in the region where the solder 18 has been applied. In the region of the glazing material 11 directly underneath the connector foot 15, a tensile stress is produced, whereas in the region of the glazing material 11 underneath the connector bridge 17, a compressive stress is produced. Any flaw at the glazing material surface produces a region of high tensile stress.

In the present invention it has been appreciated that optimising the design of the connector offers a practical alternative to the approaches of the prior art for improving the reliability of the solder joint between an electrical connector and a bus bar on an automotive glazing. In particular, two features of the design of the connector may be optimised to improve the adhesion between the connector and the bus bar:

a) the height of the connector bridge h; and
b) the height of the protrusions on the connector feet d.

In each of the tests below, the metallic connectors used are of the T-piece type.

Connector Bridge Height

Tests were carried out to determine the effect of connector bridge height on adhesion immediately after soldering. Samples were made from 4 mm thick flat float glass, having a fired-ink obscuration band (printed using IT57M202 black ceramic ink, available from Johnson Matthey, Fregatweg 38, 6222 NZ Maastricht, The Netherlands), and bus bars printed using SP1876 silver-containing ink (available from Ferro AG, Gutleutstrasses 215, PO Box 110403, D60039, Frankfurt-am-Main, Germany). The solder used was a lead-containing solder, including, by weight, 25% tin, 62% lead, 3% silver and 10% bismuth (available from Anglo Production Processes, Saxon Business Park, Hanbury Road, Stoke Prior, Bromsgrove, Worcestershire B60 4AD). The glass was toughened between printing and soldering. A vertical pull test, where the connector was pulled perpendicular to the surface of the glass, was used to measure the load required to pull the connector from the bus bar. Connectors with bridge heights of 0.5 mm, 1.0 mm, 1.5 mm and 2.0 mm were used. The mean loads required to remove the connectors are shown in Table 1.

TABLE 1

| mean applied load for bridge height test samples | | | |
| --- | --- | --- | --- |
| Bridge Height 0.5 mm Load (kg) | Bridge Height 1.0 mm Load (kg) | Bridge Height 1.5 mm Load (kg) | Bridge Height 2.0 mm Load (kg) |
| 29.0 | 33.7 | 35.1 | 35.4 |

Three failure mechanisms were observed: the connector became detached through failure of the soldered joint; failure occurred at both the soldered joint and the glass surface; and the glass in the region of the soldered joint shattered before the soldered joint failed.

As can be seen from Table 1, the mean load applied to remove the connector increases with increasing bridge height. Therefore, the adhesion of the connector increases with bridge height. A desirable range for the bridge height is 1.0 mm to 5.0 mm, with the upper range only limited by factors including connector feeding and space constraints.

Connector Foot Protrusion Heights

In order to determine how the height of protrusions on each foot of the connector affected the adhesion of the connector to the bus bar, both immediately after soldering and after accelerated aging, four sets of samples, each having different protrusion heights, were pull tested. Each connector foot has two protrusions, at heights of 0 mm (i.e. no protrusions) 0.3 mm, 0.5 mm and 0.75 mm. The connectors were soldered to a bus bar printed using a mix of 80% silver and 50% silver (to give an overall silver content of 77%) pastes, (available as 1749 and 1752 from Chimet Thick Film Division, Via di Pescaiola 74, 52040 Viciomaggio (Arezzo), Italy) on 5.0 mm thick flat clear float glass (sample size 300 mm×300 mm). The glazing was toughened after printing and before soldering.

Table 2 shows the load required to pull the connector from the bus bar for each protrusion height, immediately after soldering. Three different solders were used: a lead containing solder (including, by weight, 62% lead, 25% tin, 3% silver and 10% bismuth (available from Litton, 6 First Avenue, Globe Park, Marlow, SL7 1YA)); lead-free solder (1) (including, by weight, 42% tin, 57% bismuth and 1% silver (available from Indium (UK), 7 Newmarket Court, Kingston, Milton Keynes, MK10 0AG)) and lead-free solder (2) (including, by weight, 95.5% tin, 3.8% silver and 0.7% copper (available from Multicore Solders Ltd., Kelsey House, Wood Lane End, Hemel Hempstead, HP2 4RQ)).

TABLE 2

Mean Load necessary to remove connector immediately after soldering

| Protrusion Height 0.00 mm Mean Load (kg) | Protrusion Height 0.30 mm Mean Load (kg) | Protrusion Height 0.50 mm Mean Load (kg) | Protrusion Height 0.75 mm Mean Load (kg) |
|---|---|---|---|
| Lead-containing Solder | | | |
| 42 | 38 | 39 | 36 |
| Lead-free Solder (1) | | | |
| 21 | 28 | 31 | 33 |
| Lead-free Solder (2) | | | |
| 26 | 29 | 30 | 36 |

Table 3 shows the load required to pull the connector from the bus bar for each protrusion height, after accelerated aging. The samples were aged for 14 days in a weathering cabinet at 50° C. and 95% relative humidity. Again, three different solders were used: a lead containing solder (including, by weight, 62% lead, 25% tin, 3% silver and 10% bismuth); lead-free solder (1) (including, by weight, 42% tin, 57% bismuth and 1% silver) and lead-free solder (2) (including, by weight, 95.5% tin, 3.8% silver and 0.7% copper), all available as before.

TABLE 3

Mean Load necessary to remove connector after 14 days at 50° C., 95% RH

| Protrusion Height 0.00 mm Mean Load (kg) | Protrusion Height 0.30 mm Mean Load (kg) | Protrusion Height 0.50 mm Mean Load (kg) | Protrusion Height 0.75 mm Mean Load (kg) |
|---|---|---|---|
| Lead-containing Solder | | | |
| 38 | 33 | 36 | 32 |
| Lead-free Solder (1) | | | |
| 19 | 22 | 30 | 26 |
| Lead-free Solder (2) | | | |
| 13 | 14 | 21 | 18 |

For the lead containing solder, the results in Tables 2 and 3 indicate that an increase in protrusion height has little effect on the adhesion between the connector and the bus bar, both immediately after soldering, and after accelerated aging. However, for both lead-free solder compositions, increasing the protrusion height causes an increase in adhesion immediately after soldering. After aging, an optimum protrusion height of 0.50 mm is seen for both lead-free solder compositions. From the trends in Tables 2 and 3, an upper limit of 1.0 mm for the protrusion height is desirable, with the height preferably in the range 0.3 mm to 0.75 mm.

In order to optimise the design of the electrical connector, at least one of these factors may be used to increase the adhesion between the connector and the bus bar. Preferably, both may be combined. In order to provide sufficient adhesion, it is preferred that d and h are in the ranges 1.0 mm$\leq$h$\leq$5.0 mm and 0.00 mm$\leq$d$\leq$1.00 mm, and that the mean load required to remove the connector from the bus bar is greater than or equal to 20 kg. By altering and optimising each of the bridge height and protrusion height, it is possible to produce a T-piece design, which improves the adhesion between the connector and bus bar to which it is applied. The optimised design is particularly effective when used with a lead-free solder.

The invention claimed is:

1. An automotive glazing comprising a ply of glazing material having a first electrically conductive component formed from an electrically conductive silver ink mounted thereon, and an electrical connector joined to the first electrically conductive component by a solder, the electrical connector comprising first and second connector feet linked by a bridge portion, the first and second connector feet each including a base, the bridge portion being at a height h above the base of each of the connector feet, and each of the feet optionally comprising at least one protrusion having a height d, wherein at h is in the range of 1.0 mm to less than or equal to 5.0 mm, d is in the range of 0.00 mm to 1.00 mm, and wherein at least one of h or d is chosen to maximize the adhesion between the electrical connector and the first electrically conductive component, such that when the first electrically conductive component is placed on flat float glass, and the electrical connector soldered to the first electrically conductive component, at least one of h or d is chosen such that a mean load required to remove the electrical connector is greater than 20 kg; wherein the ply of glazing material possesses a surface having a periphery, the surface of the glazing material being printed around its periphery with a fired ink band.

2. The glazing of claim 1, wherein d is in the range 0.3 mm to 0.75 mm.

3. The glazing of claim 1, wherein both h and d are chosen to improve the adhesion between the electrical connector and the first electrically conductive component.

4. The glazing of claim 1, wherein both h and d are chosen to improve the adhesion between the electrical connector and the first electrically conductive component, after 14 days at 50° C. and 95% relative humidity.

5. The glazing of claim 1, wherein the electrical connector is made of copper.

6. The glazing of claim 1, wherein the first electrically conductive component is a busbar.

7. The glazing of claim 1, wherein at least part of the first electrical component is provided on the fired-ink band.

8. The glazing of claim 1, wherein the electrical connector is a T-piece connector.

9. The glazing of claim 1, wherein the solder is a lead-free solder.

10. The glazing of claim 2, wherein both h and d are chosen to improve the adhesion between the electrical connector and the first electrically conductive component.

11. The glazing of claim 2, wherein both h and d are chosen to improve the adhesion between the electrical connector and the first electrically conductive component, after 14 days at 50° C. and 95% relative humidity.

12. The glazing of claim 2, wherein the electrical connector is made of copper.

13. The glazing of claim 2, wherein the first electrically conductive component is a busbar.

14. The glazing of claim 2, wherein the surface of the ply of glazing material is printed around its periphery with a fired ink band.

15. The glazing of claim 2, wherein the electrical connector is a T-piece connector.

16. The glazing of claim 2, wherein the solder is a lead-free solder.

17. The glazing of claim 2, wherein the glazing is an automotive glazing.

18. An automotive glazing comprising a ply of glazing material having a first electrically conductive component formed from an electrically conductive silver ink mounted thereon, and an electrical connector connected to the first electrically conductive component by a solder, the electrical connector comprising first and second connector feet each having a base and linked by a bridge portion, the bridge portion being at a height h above the base of each of the connector feet, and each of the feet optionally comprising at least one protrusion having a height d, wherein at h is in the range of 1.0 mm to less than or equal to 5.0 mm, d is in the range of 0.00 mm to 1.00 mm, and wherein at least one of h or d is chosen to maximize the adhesion between the electrical connector and the first electrically conductive component, such that when the first electrically conductive component is placed on glass, and the electrical connector soldered to the first conductive component, at least one of h or d is chosen such that the mean load required to remove the electrical connector is greater than 20 kg, wherein both h and d are chosen to improve the adhesion between the electrical connector and the first electrically conductive component, after 14 days at 50° C. and 95% relative humidity, and wherein the electrical connector is a T-piece connector.

19. The glazing of claim 18, wherein the electrical connector is made of copper.

20. The glazing of claim 18, wherein the ply of glazing material possesses a surface having a periphery, with a fired ink band printed on the periphery of the surface of the glazing material, and at least part of the first electrical component being provided on the fired-ink band.

* * * * *